(12) United States Patent
Hillis et al.

(10) Patent No.: US 7,250,595 B2
(45) Date of Patent: *Jul. 31, 2007

(54) PHOTO-DETECTOR FILTER HAVING A CASCADED LOW NOISE AMPLIFIER

(75) Inventors: W. Daniel Hillis, Encino, CA (US); Roderick A. Hyde, Livermore, CA (US); Nathan P. Myhrvold, West Medina, WA (US); Lowell L. Wood, Jr., Livermore, CA (US)

(73) Assignee: Searete, LLC, Bellevue, WA (US)

( * ) Notice: Subject to any disclaimer, the term of this patent is extended or adjusted under 35 U.S.C. 154(b) by 468 days.

This patent is subject to a terminal disclaimer.

(21) Appl. No.: 10/758,950

(22) Filed: Jan. 14, 2004

(65) Prior Publication Data

US 2005/0151057 A1    Jul. 14, 2005

(51) Int. Cl.
*H03F 3/08*    (2006.01)
(52) U.S. Cl. .................................. 250/214 A; 356/213
(58) Field of Classification Search ...................... None
See application file for complete search history.

(56) References Cited

U.S. PATENT DOCUMENTS

| | | | |
|---|---|---|---|
| 4,238,760 A | 12/1980 | Carr | |
| H101 H | 8/1986 | Walker | |
| 4,823,129 A | 4/1989 | Nelson | |
| 4,945,242 A | 7/1990 | Berger et al. | |
| 5,216,384 A | 6/1993 | Vanhecke | |
| 5,286,990 A | 2/1994 | Hynecek | |
| 5,561,287 A | 10/1996 | Turner et al. | |
| 5,854,574 A | 12/1998 | Singer et al. | |
| 5,864,146 A | 1/1999 | Karellas | |
| 5,965,875 A | 10/1999 | Merrill | |
| 6,114,910 A | 9/2000 | Goff | |
| 6,246,345 B1 | 6/2001 | Davidson et al. | |
| 6,278,142 B1 | 8/2001 | Hynecek | |
| 6,300,612 B1 | 10/2001 | Yu | |
| 6,395,576 B1 | 5/2002 | Chang et al. | |
| 6,498,346 B1 * | 12/2002 | Martin | 250/214 R |
| 6,501,400 B2 | 12/2002 | Ali | |
| 6,593,558 B1 * | 7/2003 | Edgar | 250/214.1 |
| 6,632,701 B2 | 10/2003 | Merrill | |
| 7,045,760 B2 * | 5/2006 | Hillis et al. | 250/214 R |
| 7,053,809 B2 * | 5/2006 | Hillis et al. | 330/310 |

(Continued)

FOREIGN PATENT DOCUMENTS

JP    06319042 A    11/1994

(Continued)

OTHER PUBLICATIONS

Andor Technology Website link: Andor-tech.com\low light imaging\ixon\EMCCD—"The iXon CCDs featuring EM technology are the most sensitive imaging detectors ever!".

(Continued)

*Primary Examiner*—Layla G. Lauchman
*Assistant Examiner*—Juan D. Valentin, II

(57) ABSTRACT

Method and systems related to obstructing a first predefined portion of at least one defined wavelength of light incident upon a first photo-detector array; and detecting the at least one defined wavelength of light with a photo-detector in a second photo-detector array.

70 Claims, 9 Drawing Sheets

U.S. PATENT DOCUMENTS

| | | | |
|---|---|---|---|
| 7,053,998 B2* | 5/2006 | Hillis et al. | ................. 356/213 |
| 2002/0003201 A1 | 1/2002 | Yu | |
| 2002/0030544 A1 | 3/2002 | Kulhalli et al. | |
| 2004/0119477 A1 | 6/2004 | Kazemi-Nia | |

FOREIGN PATENT DOCUMENTS

| | | | |
|---|---|---|---|
| JP | | 2003-163556 A | 6/2003 |

OTHER PUBLICATIONS

Black, Brian, Analog-to-Digital Converter Architectures and Choices for System Design, Analog Dialogue 33-8 (1999), pp. 1-4.

Denvir, Donal J., et al., Electron Multiplying CCDs, Andor Technology Ltd. UK at www.andor-tech.com.

Foveon Brochure, copyright 2002 Foveon, Inc.—website: www.foveon.com.

Lyon, Richard F., Foveon X3 Slides from Chief Scientist Richard F. Lyon's talks regarding Color Photography with Foveon X3 Sensor Technology.

Davidson, Michael W., Abramowitz, Mortimer, et al., "Digital Imaging in Optical Microscopy" at www.micro.magnet.fsu.edu/primer/digitalimaging/digitalimagebasics.html; Bearing a date of Aug. 1, 2003; Printed on Feb. 23, 2004. pp. 1-17.

Coates, Colin G.; Denvir, Donal J.; Conroy, Emer; McHale, Noel; Thornbury, Keith; Hollywood, Mark; "Back-illuminated electron multiplying technology: The world's most sensitive CCD for ultra low-light microscopy"; pp. 1-10, date unknown.

PCT Intl Search Report, Intl App PCT/US09/41040.

PCT International Search Report; International App. No. PCT/US04/41041.

PCT International Search Report; International App. No. PCT/US04/43025.

U.S. Appl. No. 11/601,380, filed Nov. 16, 2006, inventor Hillis et al.

U.S. Appl. No. 11/598,208, filed Nov. 9, 2006, inventor Hillis et al.

U.S. Appl. No. 11/303,182, filed Dec. 12, 2005, inventor Hillis et al.

U.S. Appl. No. 11/255,067, filed Oct. 20, 2005, inventor Hillis et al.

U.S. Appl. No. 10/789,802, filed Feb. 26, 2004, inventor Hillis et al.

PCT International Search Report; International Appl. No. PCT/US04/4324; Feb. 9, 2007.

* cited by examiner

PHOTO-DETECTOR FILTER HAVING A CASCADED LOW NOISE AMPLIFIER

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC 119(e) for provisional patent applications), and incorporates by reference in its entirety all subject matter of the following listed application(s) to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s).

1. For the purposes of the USPTO extra-statutory requirements, the present application constitutes a continuation-in-part of U.S. patent application Ser. No. 10/744,057 entitled PHOTO-DETECTOR FILTER, naming W. Daniel Hillis, Roderick A. Hyde, Nathan P. Myhrvold, and Lowell L. Wood, Jr. as inventors, filed Dec. 22, 2003, which is currently co-pending, or is an application of which a currently co-pending application is entitled to the benefit of the filing date.

2. For the purposes of the USPTO extra-statutory requirements, the present application constitutes a continuation-in-part of U.S. patent application Ser. No. 10/742,517 entitled ANALOG-TO-DIGITAL CONVERTER CIRCUITRY, naming W. Daniel Hillis, Nathan P. Myhrvold, and Lowell L. Wood, Jr. as inventors, filed Dec. 19, 2003, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

TECHNICAL FIELD

The present application relates, in general, to photo-detector systems.

SUMMARY

In one aspect, a system includes but is not limited to: a first photo-detector array configured to obstruct a first predefined portion of at least one defined wavelength of light impinging upon said first photo-detector array; a second photo-detector array sensitive to the at least one defined wavelength of light, said second photo-detector array positioned proximate to said first photo-detector array; and at least one cascade of N gain elements operably couplable with at least one of said first photo-detector array and said second photo-detector array, the at least one cascade having at least (i) N greater than or equal to a positive integer sufficient to provide said at least one cascade with a gain such that a predetermined operable signal at an input of said at least one cascade generates a signal at an output of said at least one cascade that is larger than a predetermined operable threshold value, (ii) an input of a first gain element of said at least one cascade operably couplable with the at least one of said first photo-detector array and said second photo-detector array, and (iii) a gain element of the at least one cascade having a gain larger than one by an amount such that a noise factor of said at least one cascade operating on the predetermined operable signal at the input of said at least one cascade is substantially minimized. Other related system aspects are shown and described elsewhere herein.

In one aspect, a method of constructing a system includes but is not limited to: forming a first photo-detector array configured to obstruct a first predefined portion of at least one defined wavelength of light impinging thereupon; forming a second photo-detector array sensitive to the at least one defined wavelength of light in a vicinity of the first photo-detector array; configuring a first gain element such that an input of the first gain element is operable to receive an input signal from at least one of the first photo-detector array and the second photo-detector array; connecting an output of a k'th gain element to an input of a k+1'th gain element, wherein k is an integer that is at least 1; configuring an N'th gain element of a cascade of N gain elements such that an output of the N'th gain element is operable to generate an output signal; and N being a positive integer such that a ratio between the output signal and the input signal is larger than a predetermined threshold gain when the input signal is received at the input of the first gain element. Other related method aspects are shown and described elsewhere herein.

In one aspect, a method of detecting light includes but is not limited to: obstructing a first predefined portion of at least one defined wavelength of light incident upon a first photo-detector array; detecting the at least one defined wavelength of light with a photo-detector in a second photo-detector array; and receiving at least one signal representative of the least one defined wavelength of light with at least one cascade of N gain elements operably coupled with at least one of the first photo-detector array and the second photo-detector array, the at least one cascade having at least (ii) N greater than or equal to a positive integer sufficient to provide said at least one cascade with a gain such that a predetermined operable signal at an input of said at least one cascade generates a signal at an output of said at least one cascade that is larger than a predetermined operable threshold value, (ii) an input of a first gain element of said at least one cascade operably couplable with the at least one of the first photo-detector array and the second photo-detector array, and (iii) a gain element of the at least one cascade having a gain larger than one by an amount such that a noise factor of said at least one cascade operating on the predetermined operable signal at the input of said at least one cascade is substantially minimized. Other related method aspects are shown and described elsewhere herein.

In one or more various aspects, related systems include but are not limited to circuitry and/or programming for effecting the method aspects described in the text and/or drawings of the present application; the circuitry and/or programming can be virtually any combination of hardware, software, and/or firmware configured to effect the foregoing-referenced method aspects depending upon the design choices of the system designer.

Various other method and or system aspects are set forth and described in the text (e.g., claims and/or detailed description) and/or drawings of the present application.

The foregoing is a summary and thus contains, by necessity; simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE FIGURES

The use of the same symbols in different drawings typically indicates similar or identical items.

DETAILED DESCRIPTION

I. Photo-Detector Device(s) and/or Process(es)

Figure 1:
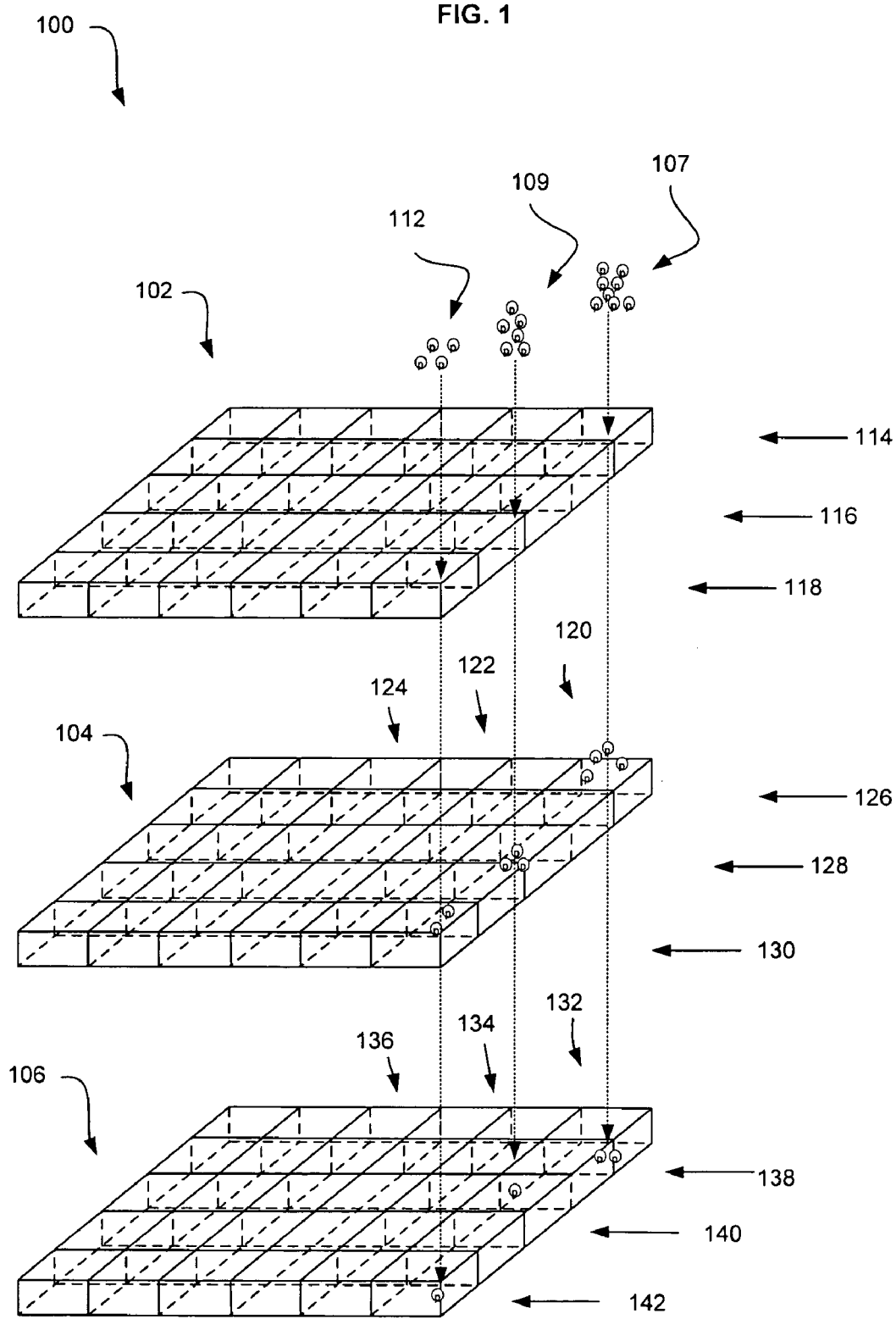
FIG. 1 shows structure 100 that includes photo-detector arrays 102, 104, and 106.

With reference to the Figures, and with reference now to FIG. 1, shown is structure 100 that includes photo-detector arrays 102, 104, and 106. Example implementations of photo-detector arrays 102, 104, and 106 include but are not limited to charge coupled device (CCD) sensor arrays, complementary metal oxide semiconductor (CMOS) sensor arrays, and/or mixtures of CCD and CMOS arrays. Those having skill in the art may substitute other suitable types of photo-detector arrays in view of the teachings herein with a reasonable amount of experimentation.

Photon groups 107, 109, and 112 are depicted as respectively impinging upon photo-detectors 114, 116, and 118 of photo-detector array 102. Photo-detector array 102 is depicted as configured to obstruct a predefined portion of at least one defined wavelength of light impinging upon photo-detector array 102. As one specific example, photo-detectors 114, 116, and 118 of photo-detector array 102 are illustrated as obstructing ½, or 50%, of the photons of photon groups 107, 109, and 112 impinging upon photo-detector array 102. (While the examples herein are shown in terms of integral numbers of photons for clarity of presentation, those skilled in the art will recognize that other relative measures of brightness, intensity, power density, and/or other properties of light exist; specifically, those having skill in the art will recognize that the response of specific devices may operate on a square law format, straight linear format, or other format.) Those skilled in the art will recognize that the obstruction level of 50% discussed herein is illustrative only, and that different obstruction levels are possible. Similarly, those skilled in the art will recognize that the obstruction level may be chosen to be different in some or all of the specific photo-detectors.

Unobstructed portions 120, 122, and 124 of photon groups 107, 109, and 112, respectively, are shown impinging upon photo-detectors 126, 128, and 130 of photo-detector array 104. Photo-detector array 104 is depicted as configured to obstruct a predefined portion of at least one defined wavelength of light impinging upon photo-detector array 104. As one specific example, photo-detectors 126, 128, and 130 of photo-detector array 104 are illustrated as obstructing ½, or 50%, of the photons of portions 120, 122, and 124 of light impinging upon photo-detector array 104.

Unobstructed portions 132, 134, and 136 of portions 120, 122, and 124, respectively, are shown impinging upon photo-detectors 138, 140, and 142 of photo-detector array 106. Photo-detector array 106 is depicted as configured to obstruct a predefined portion of at least one defined wavelength of light impinging upon photo-detector detector array 106. As one specific example, photo-detectors 138, 140, and 142 of photo-detector array 106 are illustrated as obstructing ½, or 50%, of the photons of portions 132, 134, and 136 impinging upon photo-detector array 106 (the single photon that would emerge from photo-detector 138 is not shown for sake of clarity of presentation).

There are multiple advantages arising from structure 100. A few of these advantages will now be explicitly discussed in the context of processes shown and/or described in relation to FIGS. 2 and 3. For example, insofar as the predetermined portions obstructed and/or unobstructed by photo-detector arrays 102, 104, and 106 are known, the array levels at which light is detected will allow strong inferences to be made as to the intensity of photon groups 107, 109, and 112 respectively impinging upon photo-detectors 114, 116, and 118 of photo-detector array 102. Another advantage is that, insofar as photo-detector arrays 102, 104, and 106 are layered, the various layers may provide for more accuracy. Yet another advantage is that, insofar as photo-detector arrays 102, 104, and 106 are layered, the various layers may extend the dynamic range far beyond the saturation point of the photo-detectors in upper level photo-detectors, such as the photo-detectors in photo-detector array 102.

Figure 2:
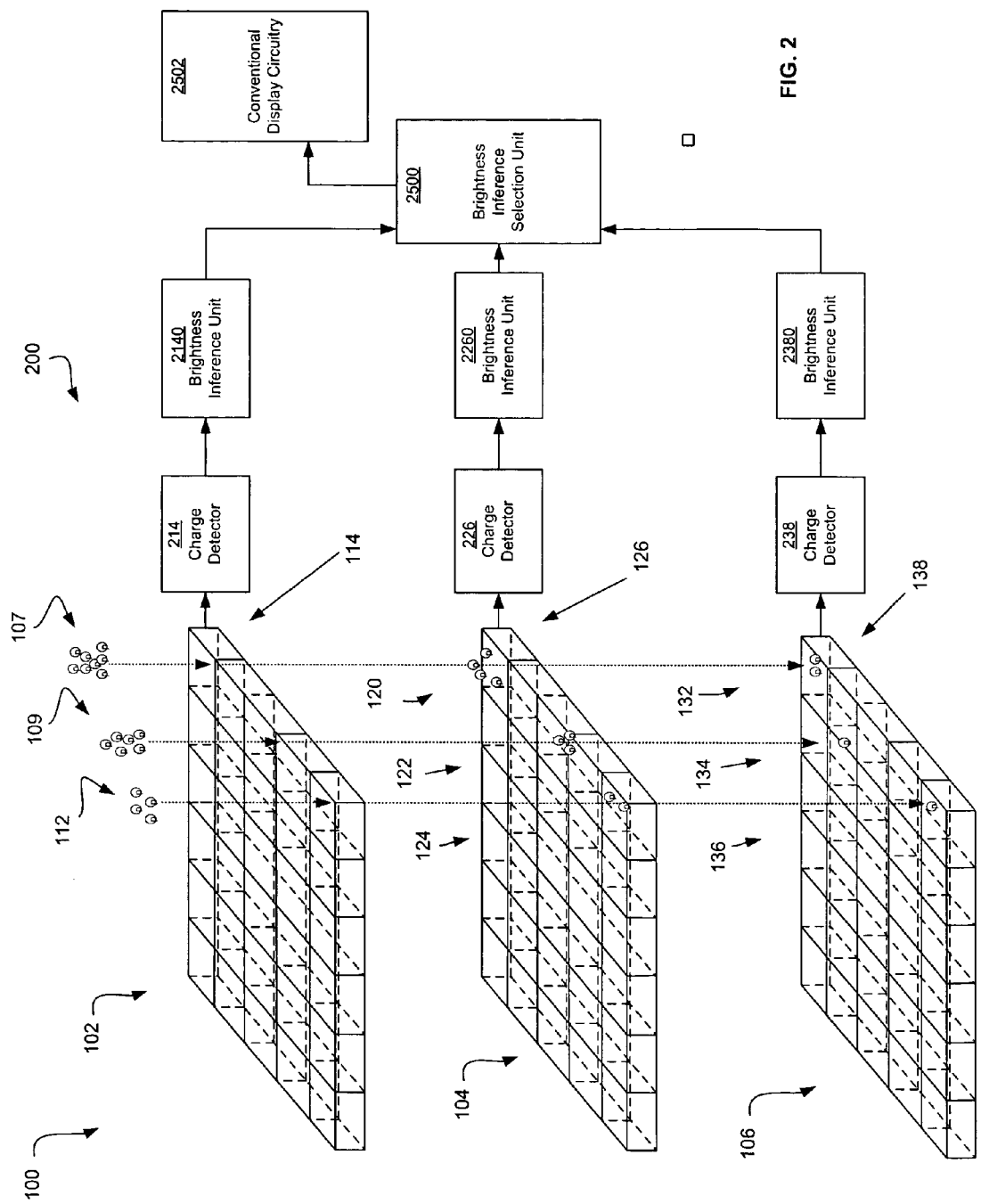
FIG. 2 depicts system 200 that includes the subject matter shown in FIG. 1.

Referring now to FIG. 2, depicted is system 200 that includes the subject matter shown in FIG. 1. System 200 may form an environment for a process that serves to illustrate a few of the advantages of structure 100. As a specific example, shown following is that, in the event that the photo-detectors of photo-detector arrays 102, 104, and 106 are such that they saturate after the incidence of 6 photons, structure 100 will allow an image to be gathered that exceeds the saturation point of the photo-detectors of uppermost photo-detector array 102. Specifically, although the photo-detectors saturate after 6 photons, the example of FIG. 2 shows that intensity at photo-detector array 102 can be inferred beyond the dynamic range of photo-detector array 102.

Charge detectors 238, 226, and 214 are shown as coupled to detect the charge in photo-detectors 138, 126, and 114, respectively. Brightness inference units 2380, 2260, and 2140 are shown as coupled to calculate the intensity indicated by charge detectors 238, 226, and 214, respectively. Although only a few specific charge detector-brightness inference unit combinations are shown and described herein, those having skill in the art will recognize that, in most implementations, generally most photo-detectors in use will be coupled to one or more similar charge detector-brightness inference unit combinations, which will thereafter couple with one or more brightness inference selection units 2500. Those having skill in the art will recognize that the teaching herein can be extended to virtually all suitable photo-detector arrays, including but not limited to Vertical, Linear, Interline, Full-frame, and Frame-transfer arrays via a reasonable amount of experimentation. The conventional aspects of such photo-detector architectures are not described herein for sake of brevity.

Charge detector 238 is depicted as coupled to detect the charge in photo-detector 138. Charge detector 238 is further shown as coupled to brightness inference unit 2380. Brightness inference unit 2380 has knowledge of photo-detector 106's relative place in the stack and the predetermined light obstruction/unobstruction characteristics of the photo-detectors in the stack above photo-detector 106. Accordingly, brightness inference unit 2380 can calculate a likely intensity of photon-group 107 impinging on uppermost photo-detector array 102. As a specific example, the fact that photo-detector 126 of photo-detector array 104 is known to obstruct ½, or 50%, of its incident photons—coupled with the information from charge detector 238 that 2 photons have impinged upon photo-detector 138—allows brightness inference unit 2380 to calculate that approximately four photons were incident upon photo-detector 126. Brightness inference unit 2380 can thereafter use this 4-photon inference coupled with the fact that photo-detector 114 of photo-detector array 102 is known to obstruct ½, or 50%, of its incident photons to calculate that approximately 8 photons were incident upon photo-detector 114.

Charge detector 226 and brightness inference unit 2260 are depicted as working in a fashion similar to charge detector 238 and brightness inference unit 2380 to calculate that the 4 photons received by photo-detector 126 indicate that approximately 8 photons were received by photo-detector 114.

Charge detector 214 and brightness inference unit 2140 are illustrated as working in a fashion similar to charge detector 238 and brightness inference unit 2380 to calculate that the 8 photons received by photo-detector 114 indicate that approximately 6 photons were received by photo-detector 114, since photo-detector 114—for sake of example—is assumed to saturate at 6 photons.

Brightness inference selection unit 2500 is shown as coupled to receive the results of brightness inference units 2380, 2260, and 2140. Brightness inference selection unit 2500 runs various selection routines to determine which of brightness inference units 2380, 2260, and 2140 are likely most accurate. Continuing with the present example, brightness inference selection unit 2500 would note that brightness inference unit 2140's calculation was at the threshold saturation point of photo-detector 114, and would mark that calculation as suspect. Thereafter, brightness inference selection unit 2500 would note that brightness inference unit 2260's and 2380's calculations were above the threshold saturation point of photo-detector 114. Consequently, brightness inference selection unit 2500 would average brightness inference unit 2260's and 2380's calculations (ignoring brightness inference unit 2140's at-threshold calculation) to get a brightness inference of 8 photons.

Brightness inference selection unit 2500 is depicted as coupled to conventional display circuitry 2502. Conventional display circuitry 2502 typically expects to receive one of a number of discrete signals indicative of pixel brightness (what those signals are constitutes a conventional design choice). Continuing with the present example, brightness inference selection unit 2500 generates a signal indicative of 8 photon brightness and delivers that signal over to conventional display circuitry 2502, which then uses the signal in a conventional fashion to produce an image representation.

Figure 3:
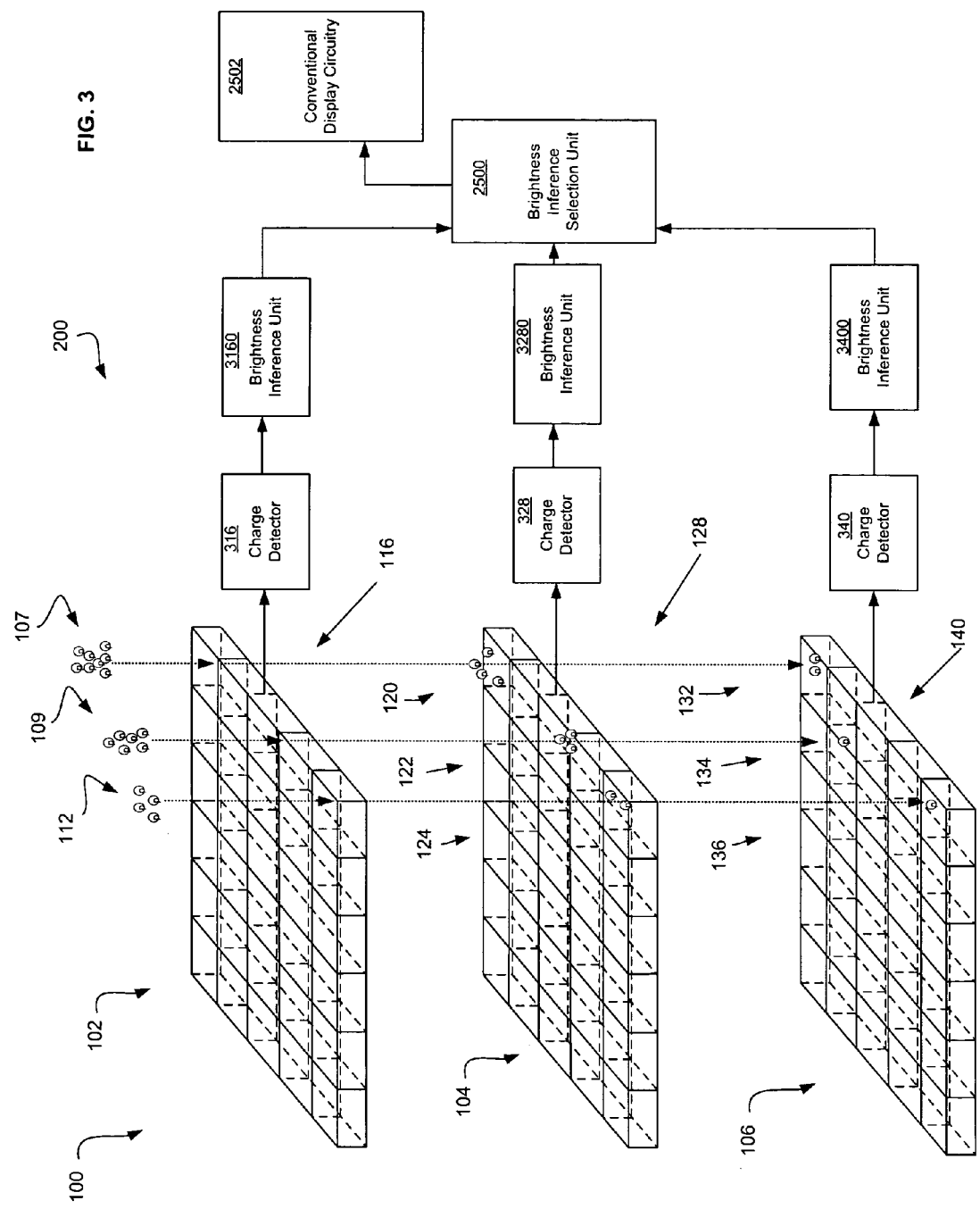
FIG. 3 depicts system 200 that includes the subject matter shown in FIG. 1.

With reference now to FIG. 3, depicted is system 200 that includes the subject matter shown in FIG. 1. System 200 may form an environment for a process that serves to illustrate of few of the advantages of structure 100. As a specific example, shown following is that, in the event that photon group 109 is such that there is "quantization error" introduced by the filtering photo-detectors, the fact that there are multiple layers of filters allows system 200 to increase the likelihood that such "quantization errors" can be corrected.

Charge detector 340 is depicted as coupled to detect the charge in photo-detector 140. Charge detector 340 is further shown as coupled to brightness inference unit 3400. Brightness inference unit 3400 has knowledge of photo-detector array 106's (e.g., photo-detector 140's) relative place in the stack and the predetermined light obstruction/unobstruction characteristics of the photo-detectors in the stack above photo-detector array 106 (photo-detector 140). Accordingly, brightness inference unit 3400 can calculate a likely intensity of photon-group 109 impinging on uppermost photo-detector array 102. As a specific example, the fact that photo-detector 128 of photo-detector array 104 is known to obstruct ½, or 50%, of its incident photons—coupled with the information from charge detector 340 that 1 photon has impinged upon photo-detector 140—allows brightness inference unit 3400 to calculate that approximately 2 photons were incident upon photo-detector 128; unfortunately, since the 1 photon impinging upon photo-detector 140 is the result of photo-detector 128 filtering 50% of 3 photons, there is quantization error in the filtering which makes this calculated intensity of the light at photo-detector array 104 less accurate than without the quantization error. Brightness inference unit 3400 can thereafter use this 2-photon inference coupled with the fact that photo-detector 116 of photo-detector array 102 is known to obstruct ½, or 50%, of its incident photons to calculate that approximately 4 photons were incident upon photo-detector 116.

Charge detector 328 and brightness inference unit 3280 are depicted as working in a fashion similar to charge detector 340 and brightness inference unit 3400. Brightness inference unit 3280 has knowledge of photo-detector array 104's (e.g., photo-detector 128's) relative place in the stack and the predetermined light obstruction/unobstruction characteristics of the photo-detector in the stack above photo-detector 104 (e.g., photo-detector 128). Accordingly, brightness inference unit 3280 can calculate a likely intensity of photon-group 109 impinging on uppermost photo-detector array 102. Continuing with the present example, the fact that photo-detector 116 of photo-detector array 102 is known to obstruct ½, or 50%, of the photons, coupled with the information from charge detector 328 that 3 photons have impinged upon photo-detector 128 allows brightness inference unit 3280 to calculate that approximately 6 photons were incident upon photo-detector 116. Brightness inference unit 3280 can thereafter use this 6-photon inference coupled with the fact that photo-detector 116 of photo-detector array 102 is known to obstruct ½, or 50%, of the photons to calculate that approximately 6 photons were incident upon photo-detector 116.

Charge detector 316 and brightness inference unit 3160 are illustrated as working in a fashion similar to charge detector 340 and brightness inference unit 3400 to calculate that the 6 photons received by photo-detector 116 indicate that approximately 6 photons were received by photo-detector 116.

Brightness inference selection unit 2500 is shown as coupled to receive the results of brightness inference units 3400, 3280, and 3160. Brightness inference selection unit 2500 runs various selection routines to determine which of brightness inference units 3400, 3280, and 3160 are likely most accurate. Continuing with the present example, brightness inference selection unit 2500 would note that brightness inference unit 3160's calculation was at the threshold saturation point of photo-detector 114, and would mark that calculation as suspect. Thereafter, brightness inference selection unit 2500 would note that brightness inference unit 3280's and 3400's calculations do not agree. Consequently, brightness inference selection unit 2500 would detect that brightness inference unit 3280's calculation matched brightness inference unit 3160's calculation, even though brightness inference unit 3160's calculation shows a threshold saturation value; accordingly, brightness inference selection unit would treat brightness inference unit 3160's calculation as accurate and then average all three calculations of brightness inference units 3400, 3280, and 3160 (e.g., (4+6+6)/3=5.33) to select a brightness inference of 6 photons as most likely; alternatively, the fact that brightness inference unit 3280 makes its threshold inference based on more collected charge (e.g., as indicated by charge detector 328) than the charge collected by lowermost brightness inference unit 3400 could be used to decide that brightness inference unit 3280's calculation was the more accurate. Those having skill in the art will appreciate other selection routines in light of the teachings herein.

Photo-detector arrays 102, 104, 106 have been described herein as configured to obstruct predefined portions of at least one defined wavelength of light impinging upon photo-detector arrays 102, 104, 106. There are many different ways in which such photo-detector arrays may be implemented. In some implementations of the photo-detector arrays, at least one photo-detector is constructed to provide an optical filter having a passband including at least one of a red, a blue, and a green visible light wavelength. Exemplary implementations include photo-detectors constructed to filter red, blue, and green visible light wavelengths either individually or in some combination thereof. Other exemplary implementations include photo-detectors constructed to filter 400 through 800 nm wavelengths of light either individually or in some combination thereof.

In other implementations of the photo-detector arrays, at least one photo-detector is constructed to provide a substantially neutral density filter (neutral density filters attenuate incident light without significantly altering its spectral distribution over a defined group of wavelengths of interest). In one exemplary implementation, one or more photo-detectors are constructed to provide a neutral density filter that decreases an intensity of light energy without substantially altering a relative spectral distribution of an unobstructed portion of the light energy. In another exemplary implementation, one or more photo-detectors are constructed to provide a substantially neutral density filter that filters an entire visible spectrum substantially evenly without substantially influencing at least one of color and contrast of an unobstructed portion of the entire visible spectrum. In another exemplary implementation, one or more photo-detectors are constructed to provide a substantially neutral density filter that utilizes at least one of absorption and reflection. In another exemplary implementation, one or more photo-detectors are constructed to provide a substantially neutral density filter that filters substantially ½ of the light impinging upon the photo-detectors. In another exemplary implementation, one or more photo-detectors are constructed to provide a substantially neutral density filter that filters a defined portion of photons at least partially composing the light impinging upon said first photo-detector. The examples herein are not intended to be exhaustive, and those having skill in the art may substitute other types of photo-detector arrays in view of the teachings herein with a reasonable amount of experimentation.

Figure 4:
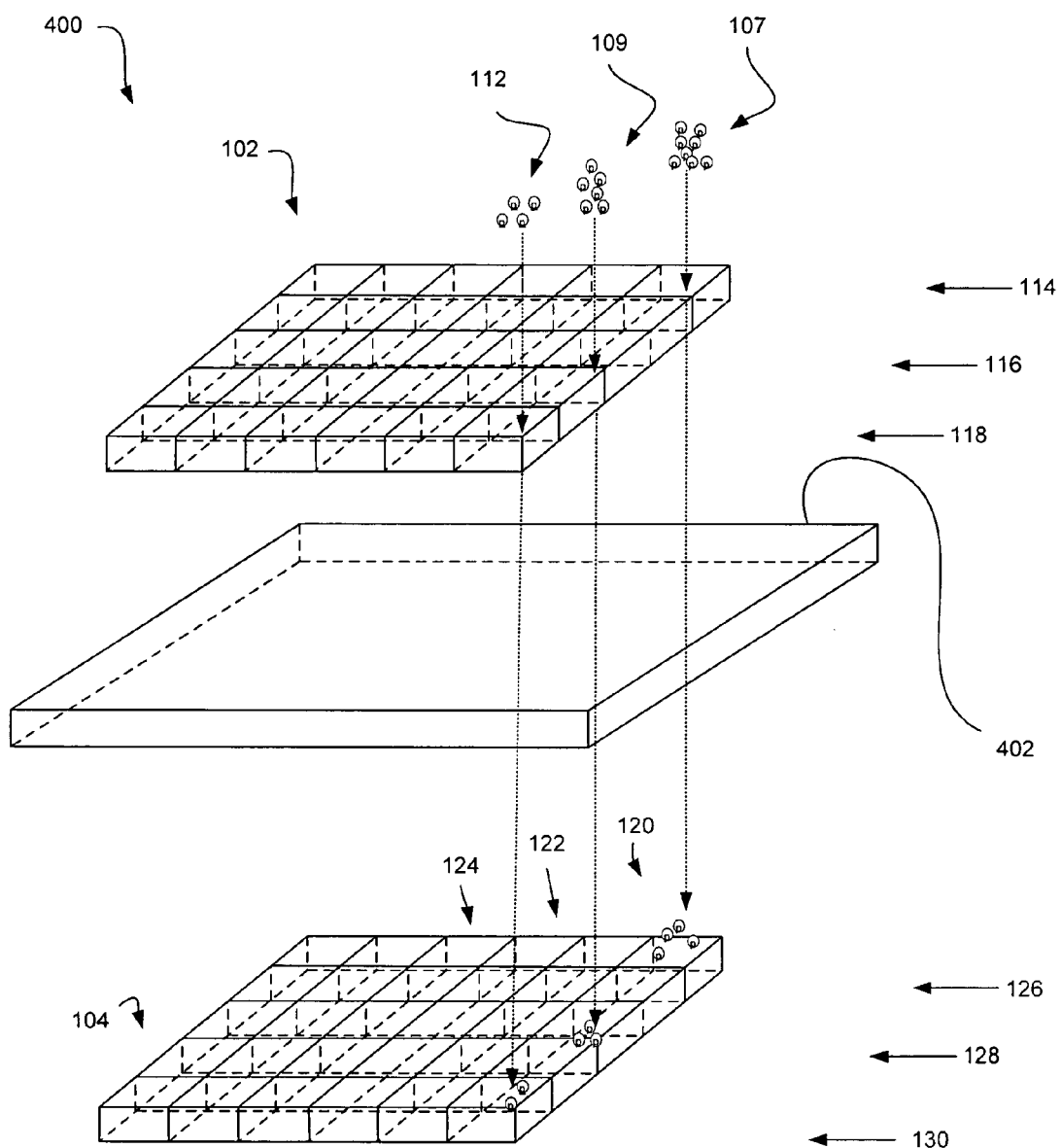
FIG. 4 shows structure 400 that constitutes an alternate implementation of structure 100.

Referring now to FIG. 4, shown is structure 400 that constitutes an alternate implementation of structure 100. Spectrally dependent filter 402 is depicted interposed between photo-detector array 102 and photo-detector array 104. Those skilled in the art will recognize that spectrally-dependent filter 402 can be either monolithic (as shown in FIG. 4), or can be spatially differentiated using either the same pixilation pattern as in photo-detector arrays 102 or 104, or using a different pattern. Although only two photo-detector arrays and one spectrally-dependent filter are shown in FIG. 4, structure 400 is intended to be representative of its shown components repeated many times, and is also intended to be representative of a composite of structures 100 of FIG. 1 and structure 400 of FIG. 4. In addition, although not explicitly shown, it will be appreciated by those having skill in the art that FIGS. 2 and 3 can be modified to include and utilize the subject matter of FIG. 4 with a routine amount of experimentation.

In one implementation, spectrally dependent filter 402 can be depicted interposed between photo-detector array 102 and photo-detector array 104. Spectrally dependent filter 402 is used to equalize the filtering of photo-detector array 102 so that the various wavelengths of portions 120, 122, and 124 have been like filtered prior to impinging upon photo-detector 104. For example, in some implementations, photo-detector array 102 will not provide a true neutral density filter function across red, blue, and green wavelength light. Specifically, assume that photo-detector array 102 allowed 50% of the red and blue light to pass but allowed 60% of the green light to pass. In such a situation, spectrally-dependent filter 402 would provide an additional green filter so that the red, blue, and green light were all filtered approximately 50% when they reached photo-detector 104.

In another implementation, spectrally dependent filter 402 can be designed to attenuate at least one first wavelength (e.g., blue light) substantially more than at least one second wavelength (e.g., red light). In such a situation, the difference between signals detected by photo-detector array 104 and photo-detector array 102, can be used to determine the spectral composition of light impinging upon structure 400.

In another example implementation of spectrally-dependent filter 402, spectrally-dependent filter 402 is constructed to filter at least one defined wavelength of light between about 400 and about 800 nano-meters.

In one example implementation of structure 400, photo-detector arrays proximate to each other are constructed of different semi-conductor materials.

In another example implementation of structure 400, spectrally-dependent filter 402 is made from a semi-conductor material that is the same as the material used in at least one of the first and second photo-detector arrays, the semi-conductor material having at least one of a doping material and a concentration chosen to meet a predefined amount of optical obstruction; in an alternate implementation, the material is different from that of a photo-detector array proximate to spectrally-dependent filter 402.

In another example implementation of structure 400, spectrally-dependent filter 402 provides its filtering/obstruction properties via at least one of absorption and reflection mechanisms.

In another example implementation of structure 400, spectrally-dependent filter 402 provides an amount of obstruction substantially different for at least one second defined wavelength of light than for the at least one defined wavelength of light which photo-detector array 102 has been configured to obstruct.

In another example implementation of structure 400, spectrally-dependent filter 402 provides an amount of obstruction substantially the same for a defined set of wavelengths, the set containing the first defined wavelength of light.

In another example implementation of structure 400, at least one photo-detector in a photo-detector array substantially matches at least one of the size, shape, and lateral location of at least one photo-detector in another photo-detector array.

In another example implementation of structure 400, at least one photo-detector in one photo-detector array is in respective substantial alignment with a plurality of photo-detectors in another photo-detector array.

In another example implementation of structure 400, the photo-detector arrays are each permeable to a first and a second defined wavelength of light.

In another example implementation of structure 400, structure 400 contains a set of N+1 photo-detector arrays, each pair of which is proximate to and separated by an optical filter, such that relative optical spectrums entering N of the photo-detector arrays are substantially different from each other, and such that a relative optical spectrum entering photo-detector array N+1 has a substantially similar relative spectrum as that relative spectrum entering the first photo-detector array.

II. Amplification and/or Conversion Device(s) and/or Process(es)

Figure 5:
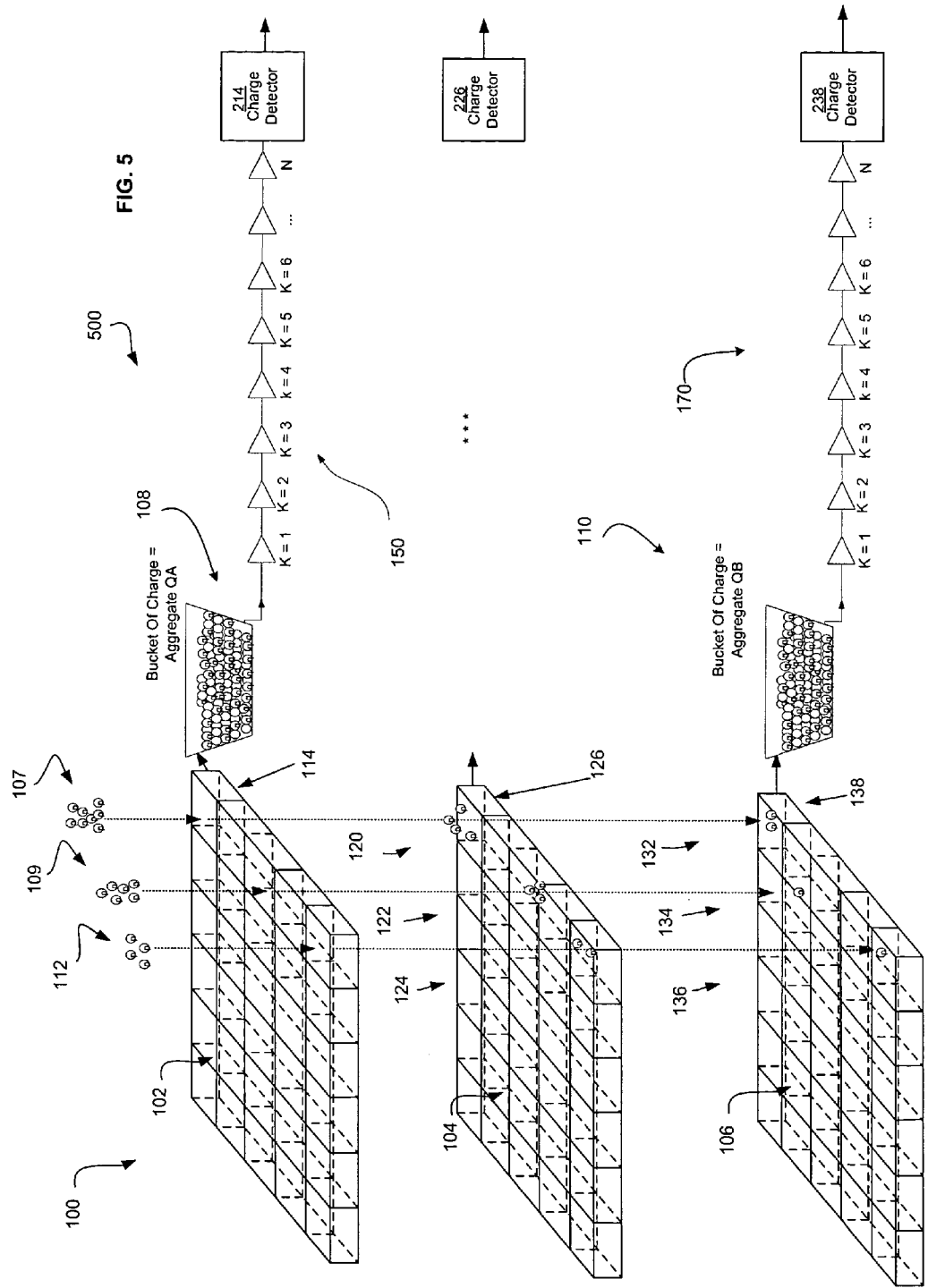
FIG. 5 depicts a partial view of system 500, which is similar to system 200 of FIG. 2 except modified as shown and described herein.

With reference now to FIG. 5, depicted is a partial view of system 500, which is similar to system 200 of FIG. 2 except modified as shown and described herein. Cascades of N gain elements are shown respectively interposed between charge detectors 214, 226, and 238 and photo-detectors 114, 126, and 138. Although only three charge detector-photo-detector pairings are explicitly described herein, it is to be understood that in typical applications an appreciable portion of respectively paired charge detectors and photo-detectors will have cascades of similarly interposed gain elements.

Photo-detector arrays 102, 104, and 106 are illustrated as having individual photo-detectors arranged in a row and column format. Those having skill in the art will appreciate that photo-detector arrays 102, 104, and 106 are meant to be inclusive of substantially all suitable photo-detector arrays, including but not limited to Vertical, Linear, Interline, Full-frame, and Frame-transfer arrays.

As noted above, charge detectors 214, 226, and 238 detect the aggregate charges of their respectively connected photo-detectors 114, 126, and 138. Each individual photo-detector 114, 126, and 138 typically collects charges generated by incident photons over a defined interval (e.g., an exposure time interval). As a shorthand notation used for ease of understanding, each photo-detector is described herein as collecting "buckets" of charge Q, where the buckets of charge are representative of light received during an interval. While examples are set forth herein in terms of charge buckets emerging from photo-detector arrays 102, 104, and 106, those having skill in the art will appreciate that the teachings herein may be applied to voltage and/or current-based configurations with a minor amount of experimentation. For example, the teachings herein may be applied to systems that include microphones, temperature detectors, thermocouples, etc. with minor amounts of experimentation.

Different buckets 108 and 110 of aggregate charge QA and QB are illustrated as having been generated by photo-detectors 114 and 138 where each bucket 108 and 110 represents the aggregate charge "Q" respectively collected by photo-detectors 114 and 138 over some period of time (e.g., an exposure time). The fact that each bucket 108, 110 contains an aggregate charge collected over time is depicted by the lowercase "q"s making up the uppercase "QA" and "QB" in buckets 108 and 110. Buckets 108 and 110 will typically contain different amounts of charge.

Buckets 108 and 110, with aggregate charges QA and QB, are shown as outputs of photo-detectors 114 and 138 applied to inputs of the respective cascades 150, 170 of k=1 to N gain elements. Although cascades 150 and 170 are each shown having N gain elements, such is not required. For instance, cascade 150 could have k=1 to J elements, where J is a different number than N.

Focusing now on cascade 170, the number N is preferably chosen to be greater than or equal to a positive integer sufficient to provide cascade 170 with a gain such that a predetermined operable signal at an input of cascade 170 generates a signal at an output of cascade 170 that is larger than a predetermined operable threshold value. In one implementation, this is achieved by choosing N such that when an output of photo-detector 138 is at or near the lower end of photo-detector 138's operable range the overall gain of cascade 170 will be large enough to provide charge detector 238 with a signal at or above charge detector 238's operable range lower end.

In one implementation, the gain elements of cascade 170 preferably have a gain larger than one by an amount such that the noise factor of cascade 170 operating on the predetermined signal at the input of the at least one cascade 170 is substantially minimized (e.g., having a noise factor at or near one, such as a noise factor less than 1.1 or 1.2). There are various ways in which the noise factor may be viewed. For instance, the noise factor may be viewed as the ratio of a Signal Power to Thermal Noise ratio at the input of the at least one cascade to an amplified Signal Power to Thermal Noise ratio at the output of the at least one cascade:

($S_{input}/N_{input}$)/($S_{output}/N_{output}$). Alternatively, the noise factor may be viewed as a ratio of an output noise power of the at least one cascade to the portion thereof attributable to thermal noise in an input termination at standard noise temperature. Alternatively again, the noise factor may be viewed as a ratio of actual output noise to that which would remain if the at least one cascade itself did not introduce noise. In one implementation, the gains of the gain elements in cascade 170 are chosen larger than one by an amount that is practicably small such that the noise contribution to the low noise amplifier from a gain element is substantially minimized. In one implementation, the N gain elements are preferably chosen to be very low gain amplifiers (e.g., gains greater than 1.00 (one) but less than 1.01 (one point zero one) or 1.001 (one point zero zero one) that produce very little additive noise. One example of such extremely low gain amplifiers that produce little additive noise are slightly over-biased amplifiers.

In one implementation, the N gain elements are preferably chosen to include one or more impact ionization-based amplifiers, such as those used in the Texas Instruments IMPACTRON CCDs (available from Texas Instruments Inc., Richardson, Tex., USA) or those used in the Marconi L3Vision CCDs (available from Marconi Applied Technology, United Kingdom). Such amplifiers can use a signal-boosting technique that may effectively reduce CCD readout noise by a gain factor. Impact-ionization based amplifiers preferably use special high-voltage clocking which can both initiate and then sustain an impact ionization process. When cascade 170 is implemented with such technologies, bucket 110 of charge can be multiplied such that greatly improved signal-to-noise ratio for signal levels in the vicinity of the photo-detector 138 read-noise floor may be achieved. In another implementation, the N gain elements are preferably chosen to include one or more low noise operational amplifiers.

Figure 6:
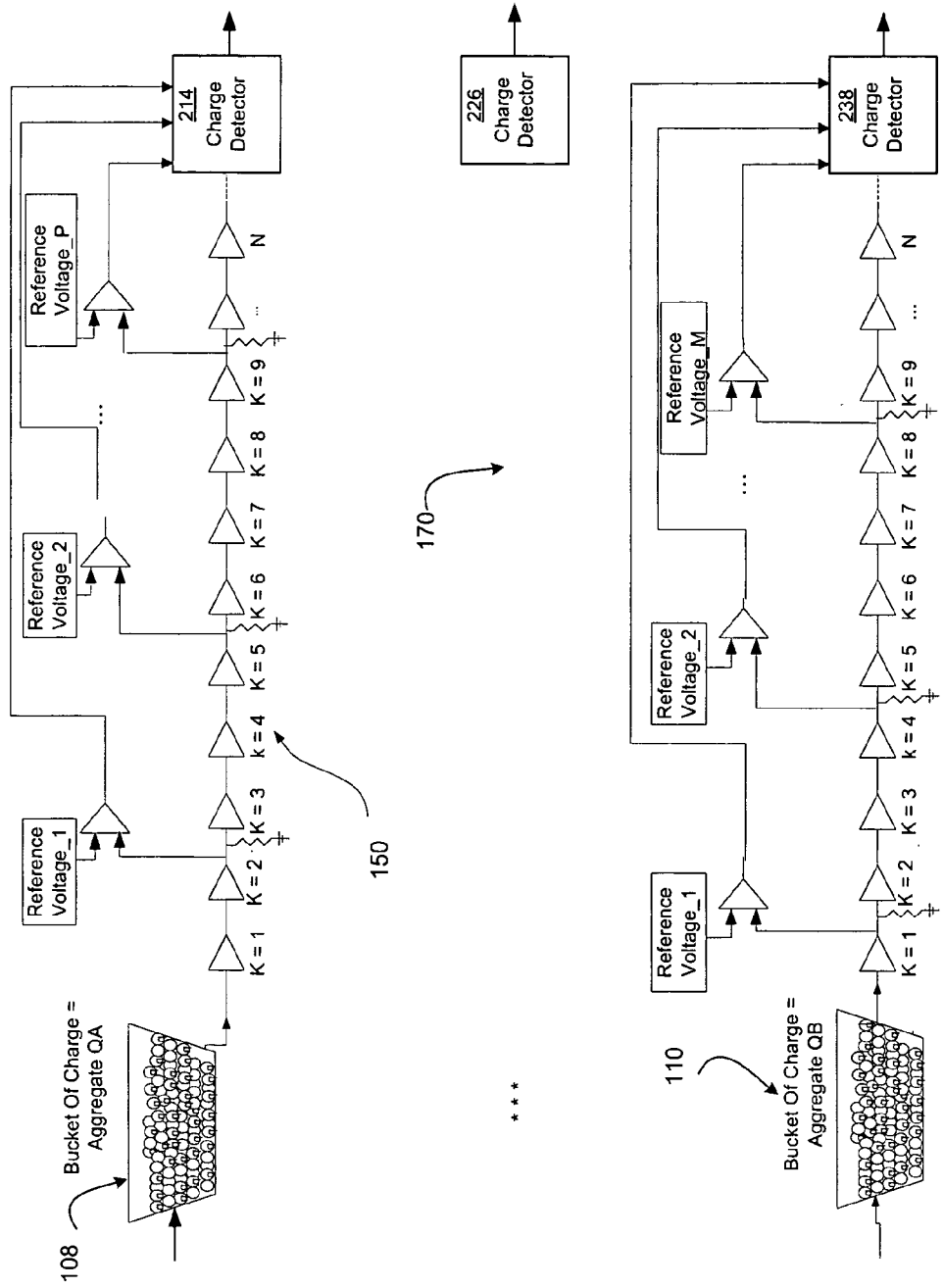
FIG. 6 shows the structure of FIG. 5, modified to provide analog-to-digital converters.

With reference now to FIG. 6, shown is the structure of FIG. 5, modified to provide analog-to-digital converters. Cascade 150 fed by bucket 108 of aggregate charge QA is shown having P attached voltage comparators. The inputs of gain elements having the attached comparators are also shown as having resistors connected to ground. These resistors are preferably large so as to draw as little current as is practicable. Each comparator is illustrated as having its own respective reference voltage depicted as reference voltage_1 through reference voltage_P. The respective comparators trigger when the voltages across their respective resistors exceed their respective reference voltages. In another embodiment (not shown) current comparators are used to directly sense the current.

Each comparator 1-P is depicted as having an output to charge detector 214. Charge detector 214 is shown as using the quantized output of the various comparators 1-P to augment the amplified value received from cascade 150 of gain elements. In one implementation, the comparators 1-P are such that charge detector 214 may use the quantized output to provide a direct quantization and/or digital conversion; these alternate implementations are depicted in FIG. 6 by the dashed line connecting the Nth gain element with charge detector 214, and are also shown and described further herein.

Cascade 170 fed by bucket 110 of aggregate charge QB is shown having M attached comparators. The inputs of gain elements having the attached comparators are also shown as having resistors connected to ground. These resistors are preferably large so as to draw as little current as is practicable. Each comparator is illustrated as having its own respective reference voltage depicted as reference voltage_1 through reference voltage_M. The respective comparators will trigger when the voltages across their respective resistors exceed their respective reference voltages. In another embodiment (not shown) current comparators are used to directly sense the current.

Each comparator 1-M is depicted as having an output to charge detector 238. Charge detector 238 is shown as using the quantized output of the various comparators 1-M to augment the amplified value received from cascade 170 of gain elements. In one implementation, the comparators 1-M are such that charge detector 238 may use the quantized output to provide a direct quantization and/or digital conversion; these alternate implementations are depicted in FIG. 6 by the dashed line connecting the Nth gain element with charge detector 238, and are also shown and described further herein.

Continuing to refer to FIG. 6, and concentrating on cascade 170 fed by bucket 110, notice that since the N gain elements are cascaded, the signal will be less amplified near the first gain element and more amplified near the Nth gain element. Accordingly, if the reference voltages 1-M were all set to have the same value, and each of the N gain elements had about the same gain values, the comparator that triggered closest to the $1^{st}$ gain element would be indicative of the amount of charge, QB, input to cascade 170. For example, for some input bucket 110 of charge, if the second comparator, with reference voltage_2, triggered, but the first comparator with reference voltage_1 did not, the known gains of the stages could be used to infer the amount of charge QB. That is, it would be known that (a) QB×Gain of Element 1<ReferenceVoltage_1; and that (b) QB×(Gain of Element 1×Gain of Element 2×Gain of Element 3×Gain of Element 4)>Reference Voltage_2. Specifically, with both reference voltage_1 and reference voltage_2 arbitrarily chosen to have a value of 2, and the gains of the first, second, third, and fourth elements all arbitrarily chosen as 1.01, the scheme would yield: QB×1.01<2=QB<1.98; and QB×(1.01×1.01×1.01×1.01)>2=QB>1.92. Thus, the structure indicates that 1.92<QB<1.98. Thereafter, QB can be further quantized and/or digitized by charge detector 238 using conventional techniques. In other embodiments the comparators and resistors can be distributed for yet more precision (e.g., 1 for every gain element). In yet other embodiments, the comparators and resistors can be distributed and the voltage reference levels manipulated in light of specified discrete changes in the amount of charge QB, thereby allowing the output of the comparators to function as direct digital output values.

Figure 7:
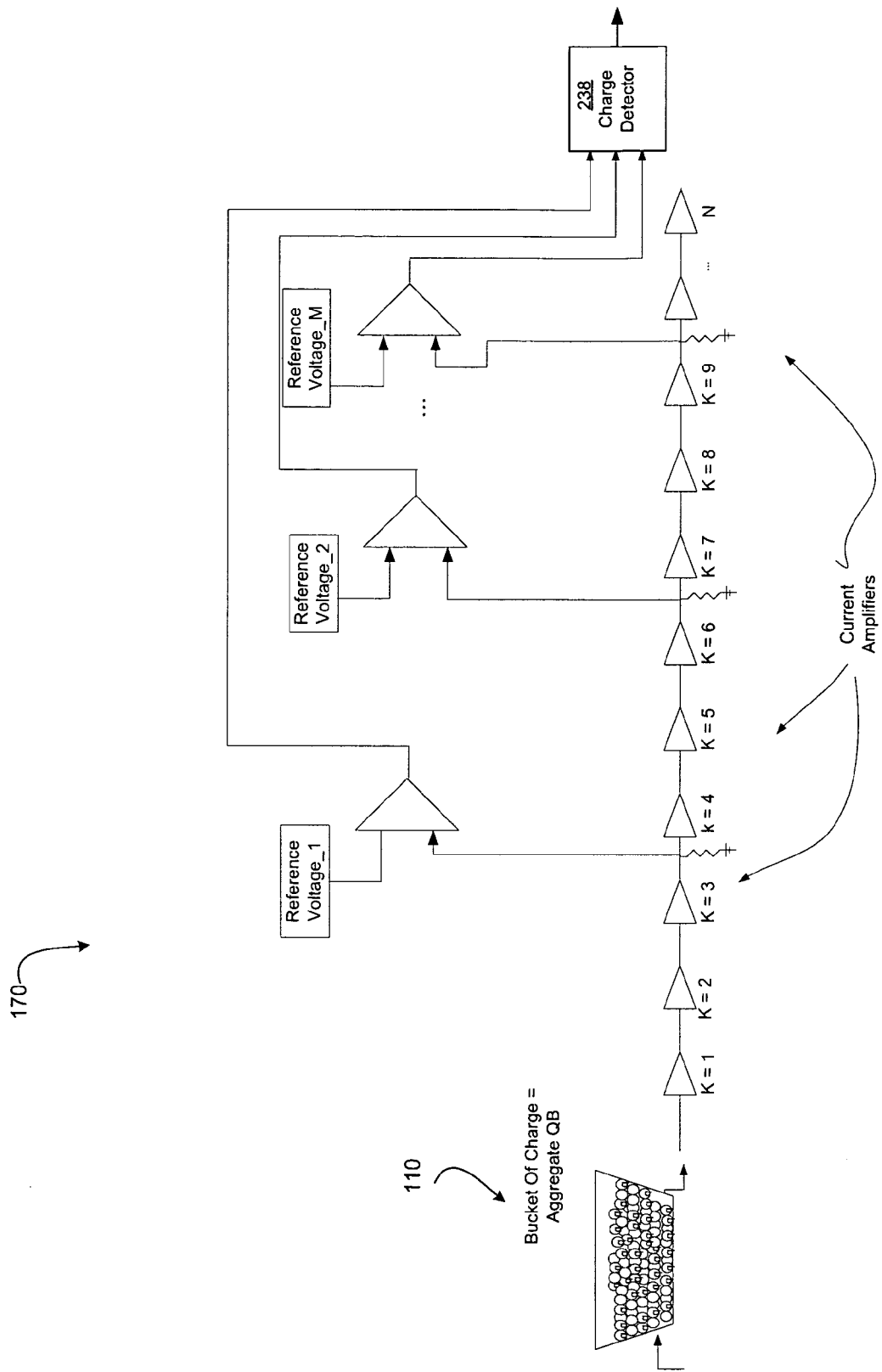
FIG. 7 illustrates a break out view of an alternate implementation of lower cascade 170 fed by bucket 110 as depicted in FIG. 6.

Referring now to FIG. 7, illustrated is a break out view of an alternate implementation of lower cascade 170 fed by bucket 110 as depicted in FIG. 6. Specifically, each of the resistors and comparators 1-M are shown respectively connected every $3^{rd}$ gain element. Comparators 1-M are depicted as connected to charge detector 238, while gain element N is shown as not connected to charge detector 238.

Assuming that the gain elements all have roughly the same gain, in this implementation, charge detector 238 may directly use the comparator outputs to get direct digital conversion of the analog charge Q2 of bucket 110.

Figure 8:
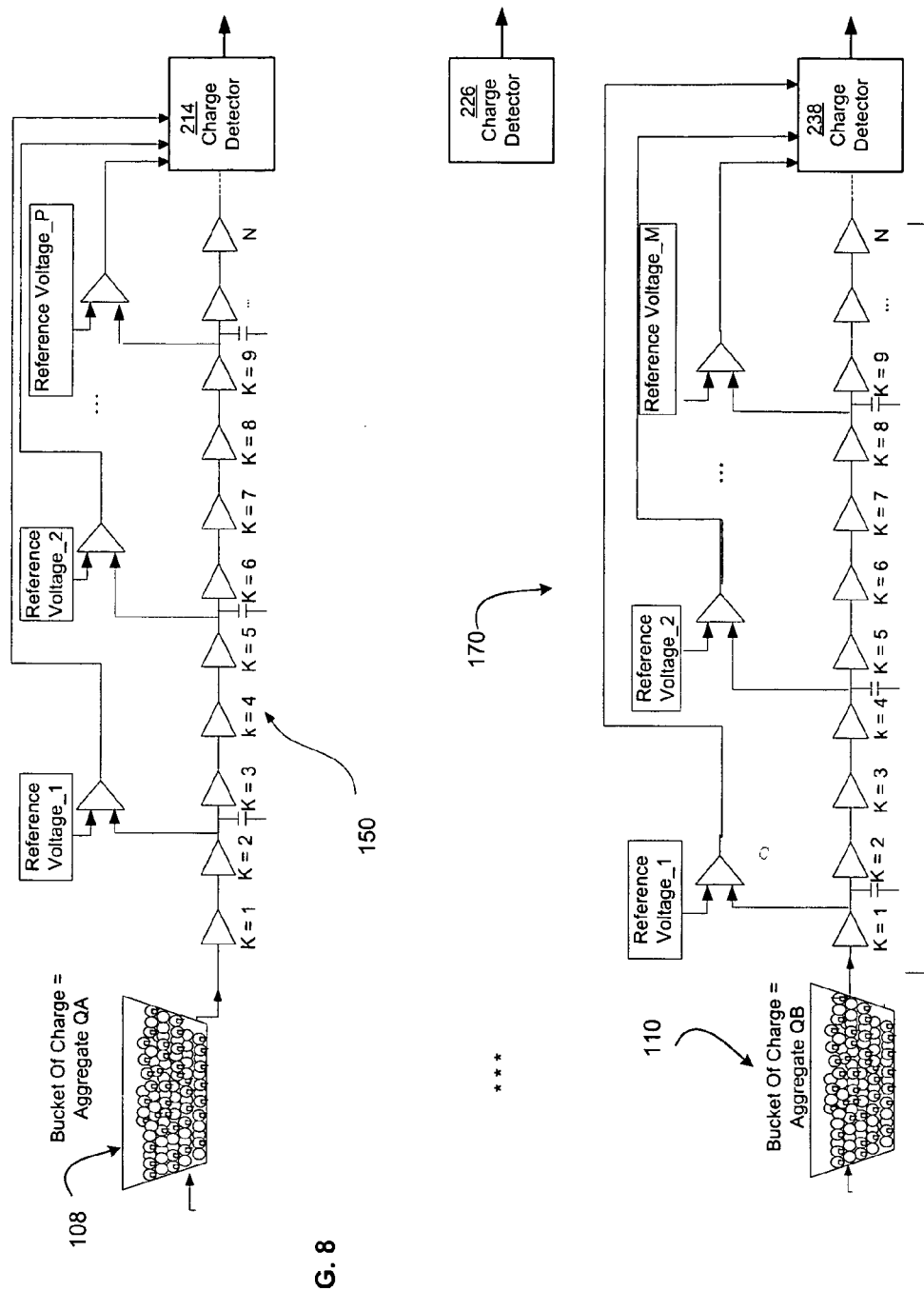
FIG. 8 shows an alternative embodiment of the structures of FIG. 6 wherein the resistors have been replaced by capacitances.

With reference now to FIG. 8, shown is an alternative embodiment of the structures of FIG. 6 wherein the resistors have been replaced by capacitances. One implementation in which the structures of FIG. 8 prove useful is that wherein the time interval between successive buckets of charge clocked into cascade 170 of N gain elements is greater than the time needed for cascade 170 to effectively settle. That is, in a circuit where cascade 170 responds so fast that cascade 170 will have effectively completed its response to bucket 110 of charge QB long before a next bucket of charge is shifted onto the input of cascade 170. As cascade 170 settles in response to bucket 100 of charge QB, the capacitors associated with the respective comparators 1-M will gather charge and present voltage which can be monitored in a fashion analogous to that described above in relation to FIG. 6. The remaining components of FIG. 8 function analogous to like components described elsewhere herein.

Figure 9:
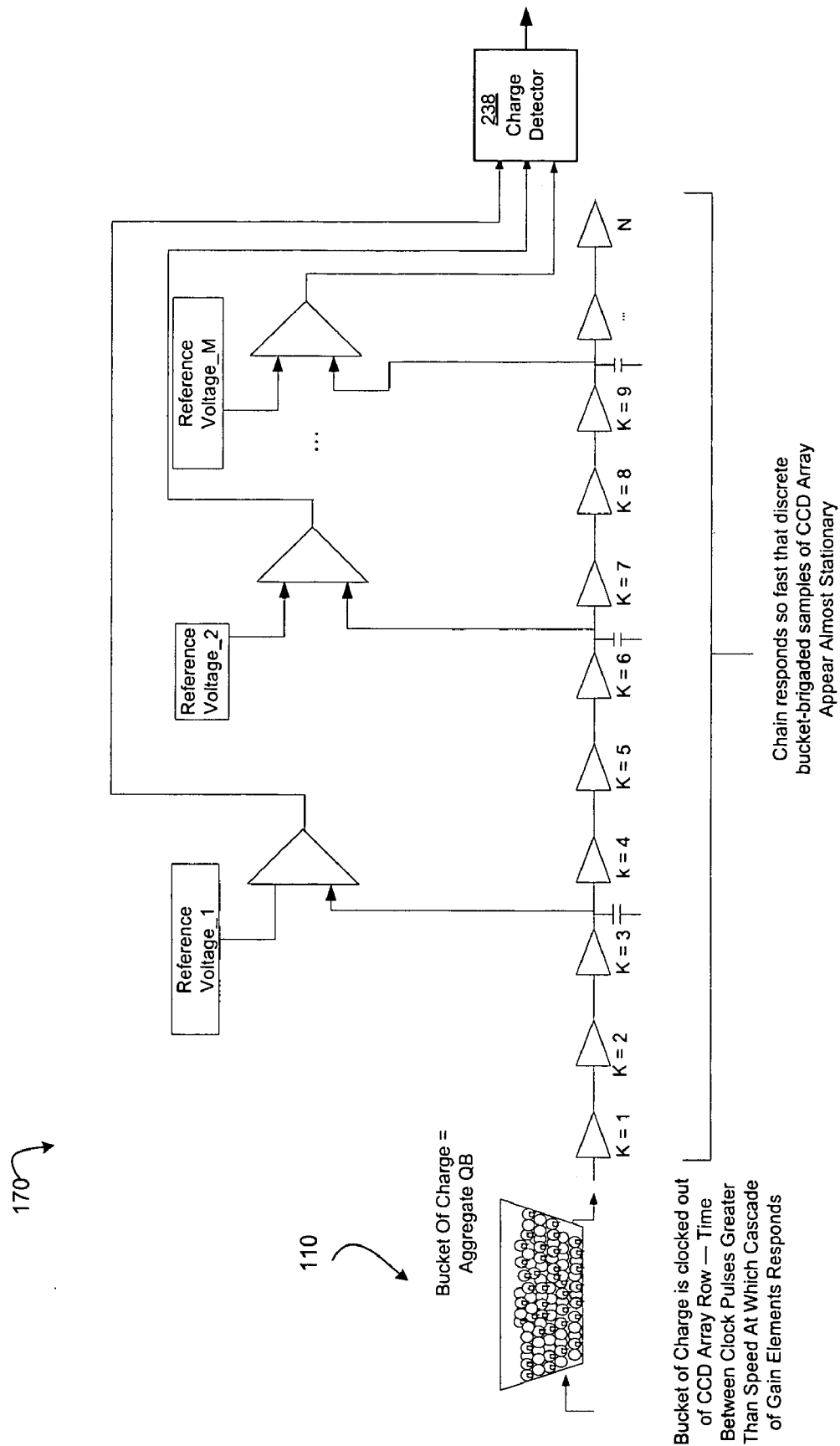
FIG. 9 shows an alternative embodiment of the structures of FIG. 7 wherein the resistors have been replaced by capacitances.

With reference now to FIG. 9, shown is an alternative embodiment of the structures of FIG. 7 wherein the resistors have been replaced by capacitances. The structures of FIG. 9 prove particularly useful in instances similar to those described in relation to FIG. 8. The components of FIG. 9 function analogous to like components described elsewhere herein.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one skilled in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by various types of electromechanical systems having a wide range of hardware, software, firmware, or virtually any combination thereof. Consequently, as used herein "electromechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs.

Those skilled in the art will recognize that it is common within the art to describe devices and/or processes in the fashion set forth herein, and thereafter use standard engineering practices to integrate such described devices and/or processes into image processing systems. That is, at least a portion of the devices and/or processes described herein can be integrated into an image processing system via a reasonable amount of experimentation. Those having skill in the art will recognize that a typical image processing system generally includes one or more of a system housing unit, a video display device, a memory such as volatile and non-volatile memory, processors such as microprocessors and digital signal processors, computational entities such as operating systems, drivers, and applications programs, one or more interaction devices, such as a touch pad or screen, control systems including feedback loops and control motors (e.g., feedback for sensing lens position and/or velocity; control motors for moving/distorting lenses to give desired focuses. A typical image processing system may be implemented utilizing any suitable commercially available components, such as those typically found in digital still systems and/or digital motion systems.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A system comprising:
   a first photo-detector array configured to obstruct a first predefined portion of at least one defined wavelength of light impinging upon said first photo-detector array;
   a second photo-detector array sensitive to the at least one defined wavelength of light, said second photo-detector array positioned proximate to said first photo-detector array; and
   at least one cascade of N gain elements operably couplable with at least one of said first photo-detector array and said second photo-detector array, the at least one cascade having at least
      N greater than or equal to a positive integer sufficient to provide said at least one cascade with a gain such that a predetermined operable signal at an input of said at least one cascade generates a signal at an output of said at least one cascade that is larger than a predetermined operable threshold value,
      an input of a gain element of said at least one cascade operably couplable with the at least one of said first photo-detector array and said second photo-detector array, and
      a gain element of the at least one cascade having a gain larger than one by an amount such that a noise factor of said at least one cascade operating on the predetermined operable signal at the input of said at least one cascade is substantially minimized.

2. The system of claim 1, wherein said first photo-detector array configured to obstruct a first predefined portion of at least one defined wavelength of light impinging upon said first photo-detector array further comprises:
   at least one of a charge coupled device (CCD) array and a complementary metal oxide semiconductor (CMOS) array.

3. The system of claim 1, wherein said first photo-detector array configured to obstruct a first predefined portion of at least one defined wavelength of light impinging upon said first photo-detector array further comprises:
   at least one photo-detector in said first photo-detector array constructed to provide an optical filter having a passband including at least one of a red, a blue, and a green visible light wavelength.

4. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter.

5. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter that decreases an intensity of light energy without substantially altering a relative spectral distribution of an unobstructed portion of the light energy.

6. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter that filters an entire visible spectrum substantially evenly without substantially influencing at least one of color and contrast of an unobstructed portion of the entire visible spectrum.

7. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter that utilizes at least one of absorption and reflection.

8. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter that filters substantially ½ of the light impinging upon said first photo-detector.

9. The system of claim 1, wherein said first photo-detector array configured to obstruct a first predefined portion of at least one defined wavelength of light impinging upon said first photo-detector array further comprises:
   at least one photo-detector in said first photo-detector array constructed to provide a substantially neutral density filter that filters a defined portion of photons at least partially composing the light impinging upon said first photo-detector.

10. The system of claim 1, wherein said second photo-detector array sensitive to the at least one defined wavelength of light, said second photo-detector array positioned proximate to said first photo-detector array further comprises:
    said second photo-detector array configured to obstruct a second predefined portion of the at least one defined wavelength of light impinging upon said second photo-detector.

11. The system of claim 10, wherein said second photo-detector array configured to obstruct a second predefined portion of the at least one defined wavelength of light impinging upon said second photo-detector further comprises:

at least one of a charge coupled device (CCD) array and a complementary metal oxide semiconductor (CMOS) array.

12. The system of claim 10, wherein said second photo-detector array configured to obstruct a second predefined portion of the at least one defined wavelength of light impinging upon said second photo-detector further comprises:
   at least one photo-detector in said second photo-detector array constructed to provide an optical filter having a passband including at least one of a red, a blue, and a green visible light wavelength.

13. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter.

14. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter that decreases an intensity of light energy without substantially altering a relative spectral distribution of an unobstructed portion of the light energy.

15. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter that filters an entire visible spectrum substantially evenly without substantially influencing at least one of color and contrast of an unobstructed portion of the entire visible spectrum.

16. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter that utilizes at least one of absorption and reflection.

17. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter that filters substantially ½ of the light impinging upon said second photo-detector.

18. The system of claim 10, wherein said second photo-detector array configured to obstruct a second predefined portion of the at least one defined wavelength of light impinging upon said second photo-detector further comprises:
   at least one photo-detector in said second photo-detector array constructed to provide a substantially neutral density filter that filters a defined portion of photons at least partially composing the light impinging upon said photo-detector.

19. The system of claim 1, wherein said second photo-detector array sensitive to the at least one defined wavelength of light, said second photo-detector array positioned proximate to said first photo-detector array further comprises:
   said first photo-detector array having a light-receiving surface and a light-transmitting surface; and
   said second photo-detector array having a light-receiving surface proximate to the light-transmitting surface of said first photo-detector.

20. The system of claim 1, wherein said second photo-detector array sensitive to the at least one defined wavelength of light, said second photo-detector array positioned proximate to said first photo-detector array further comprises:
   said first photo-detector array having a light-receiving surface and a light-transmitting surface; and
   said second photo-detector array having a light-receiving surface facing the light-transmitting surface of said first photo-detector.

21. The system of claim 1, wherein said second photo-detector array sensitive to the at least one defined wavelength of light, said second photo-detector array positioned proximate to said first photo-detector array further comprises:
   said second photo-detector array having at least one photo-detector in substantial alignment with at least one photo-detector of said first photo-detector array.

22. The system of claim 1, wherein said second photo-detector array sensitive to the at least one defined wavelength of light, said second photo-detector array positioned proximate to said first photo-detector array further comprises:
   a spectrally-dependent filter interposed between said first and said second photo-detector arrays.

23. The system of claim 1, wherein said N greater than or equal to a positive integer sufficient to provide said at least one cascade with a gain such that a predetermined operable signal at an input of said at least one cascade generates a signal at an output of said at least one cascade that is larger than a predetermined operable threshold value further comprises:
   said N is greater than or equal to a positive integer sufficient to provide said at least one cascade with a gain such that a substantially minimally rated output signal of a photo-detector array applied to the input of said at least one cascade generates a signal at the output of said at least one cascade that is larger than the predetermined threshold value.

24. The system of claim 1, wherein said N greater than or equal to a positive integer sufficient to provide said at least one cascade with a gain such that a predetermined operable signal at an input of said at least one cascade generates a signal at an output of said at least one cascade that is larger than a predetermined operable threshold value further comprises:
   said N is greater than or equal to a positive integer sufficient to provide said at least one cascade with a gain such that a predetermined signal at an input of said at least one cascade generates a signal at the output of said at least one cascade that is larger than a substantially minimally rated input of a display circuit.

25. The system of claim 1, wherein the gain larger than one by an amount such that a noise factor of said at least one cascade operating on the predetermined operable signal at the input of said at least one cascade is substantially minimized further comprises:
  a noise factor defined as the ratio of a Signal Power to Thermal Noise ratio at the input of said at least one cascade to an amplified Signal Power to Thermal Noise ratio at the output of the at least one cascade: $(S_{input}/N_{input})/(S_{output}/N_{output})$.

26. The system of claim 1, wherein the gain larger than one by an amount such that a noise factor of said at least one cascade operating on the predetermined operable signal at the input of said at least one cascade is substantially minimized further comprises:
  a noise factor defined as a ratio of an output noise power of said at least one cascade to the portion thereof attributable to thermal noise in an input termination at standard noise temperature.

27. The system of claim 1, wherein the gain larger than one by an amount such that a noise factor of said at least one cascade operating on the predetermined operable signal at the input of said at least one cascade is substantially minimized further comprises:
  a noise factor defined as a ratio of actual output noise to that which would remain if the at least one cascade itself did not introduce noise.

28. The system of claim 1, wherein the gain larger than one by an amount such that a noise factor of said at least one cascade operating on the predetermined operable signal at the input of said at least one cascade is substantially minimized further comprises:
  the gain larger than one but less than 1.001.

29. The system of claim 1, wherein the gain larger than one by an amount such that a noise factor of said at least one cascade operating on the predetermined operable signal at the input of said at least one cascade is substantially minimized further comprises:
  the gain larger than one but less than 1.01.

30. The system of claim 1, wherein the gain larger than one by an amount such that a noise factor of said at least one cascade operating on the predetermined operable signal at the input of said at least one cascade is substantially minimized further comprises:
  the gain of a gain element is larger than one by an amount that is practicably small such that the noise contribution to the low noise amplifier from a gain element is substantially minimized.

31. The system of claim 1, wherein said gain element of the at least one cascade having a gain larger than one by an amount such that a noise factor of said at least one cascade operating on the predetermined operable signal at the input of said at least one cascade is substantially minimized further comprises:
  an impact ionization-based amplifier having a gain larger than one by an amount such that the noise factor of said at least one cascade operating on the predetermined signal at the input of said cascade is substantially minimized.

32. The system of claim 31, wherein said impact ionization-based amplifier further comprises:
  a solid state electron multiplying amplifier.

33. The system of claim 1, wherein said gain element of the at least one cascade having a gain larger than one by an amount such that a noise factor of said at least one cascade operating on the predetermined operable signal at the input of said at least one cascade is substantially minimized further comprises:
  an over-biased amplifier.

34. The system of claim 1, wherein said gain larger than one by an amount such that a noise factor of said at least one cascade operating on the predetermined operable signal at the input of said at least one cascade is substantially minimized further comprises:
  the gain larger than one by an amount such that the noise factor of said at least one cascade operating on the predetermined signal at the input of said at least one cascade is less than 1.2.

35. The system of claim 1, further comprising:
  one or more output value detection circuits respectively operably coupled with one or more outputs of the N gain elements.

36. The system of claim 35, wherein said one or more output value detection circuits respectively operably coupled with one or more outputs of the N gain elements further comprises:
  one or more comparators respectively operably coupled with one or more outputs of the N gain elements.

37. The system of claim 35, wherein said one or more output value detection circuits respectively operably coupled with one or more outputs of the N gain elements further comprises:
  M comparators operably coupled with M gain elements of the at least one cascade, wherein M is an integer that is less than or equal to N; and
  M reference values operably coupled with said M comparators.

38. A method of constructing a system comprising:
  forming a first photo-detector array configured to obstruct a first predefined portion of at least one defined wavelength of light impinging thereupon;
  forming a second photo-detector array sensitive to the at least one defined wavelength of light in a vicinity of the first photo-detector array;
  configuring a first gain element such that an input of the first gain element is operable to receive an input signal from at least one of the first photo-detector array and the second photo-detector array;
  connecting an output of a k'th gain element to an input of a k+1'th gain element, wherein k is an integer that is at least 1;
  configuring an N'th gain element of a cascade of N gain elements such that an output of the N'th gain element is operable to generate an output signal; and
  N being a positive integer such that a ratio between the output signal and the input signal is larger than a predetermined threshold gain when the input signal is received at the input of the first gain element.

39. The method of claim 38, wherein said forming a first photo-detector array configured to obstruct a first predefined portion of at least one defined wavelength of light impinging thereupon comprises:
  forming a charge coupled device (CCD) array that includes at least one charge coupled device permeable to a first defined portion of light impinging thereupon.

40. The method of claim 38, wherein said forming a first photo-detector array configured to obstruct a first predefined portion of at least one defined wavelength of light impinging thereupon comprises:
  forming a complementary metal oxide semiconductor (CMOS) array that includes at least one complementary metal oxide semiconductor permeable to a first defined portion of light impinging thereupon.

41. The method of claim 38, wherein said forming a first photo-detector array configured to obstruct a first predefined portion of at least one defined wavelength of light impinging thereupon comprises:
  constructing at least one photo-detector in the first photo-detector array to provide an optical filter having a passband including at least one of a red, a blue, and a green visible light wavelength.

42. The method of claim 38, wherein said forming a first photo-detector array configured to obstruct a first predefined portion of at least one defined wavelength of light impinging thereupon comprises:
  constructing at least one photo-detector in the first photo-detector array to provide a substantially neutral density filter.

43. The method of claim 38, wherein said forming a second photo-detector array sensitive to the at least one defined wavelength of light comprises:
  forming a charge coupled device (CCD) array that includes at least one charge coupled device permeable to a second defined portion of light impinging thereupon.

44. The method of claim 38, wherein said forming a second photo-detector array sensitive to the at least one defined wavelength of light comprises:
  forming a complementary metal oxide semiconductor (CMOS) array that includes at least one complementary metal oxide semiconductor permeable to a second defined portion of light impinging thereupon.

45. The method of claim 38, wherein said forming a second photo-detector array sensitive to the at least one defined wavelength of light comprises:
  constructing at least one photo-detector in the second photo-detector array to provide an optical filter having a passband including at least one of a red, a blue, and a green visible light wavelength.

46. The method of claim 38, wherein said forming a second photo-detector array sensitive to the at least one defined wavelength of light comprises:
  constructing at least one photo-detector in the second photo-detector array to provide a substantially neutral density filter.

47. The method of claim 38, wherein said forming a second photo-detector array sensitive to the at least one defined wavelength of light comprises:
  constructing at least one photo-detector in the second photo-detector array to have substantial alignment with at least one photo-detector in the first photo-detector array.

48. The method of claim 38, further comprising:
  positioning a light-transmitting surface of a photo-detector in the first photo-detector array proximate to a light-receiving surface of a photo-detector in the second photo-detector array.

49. The method of claim 38, wherein said forming a second photo-detector array sensitive to the at least one defined wavelength of light comprises:
  interposing a spectrally-dependent filter between said first and said second photo-detector arrays.

50. The method of claim 38, wherein at least one gain element has a gain larger than one but less than 1.001.

51. The method of claim 38, wherein at least one gain element has a gain larger than one but less than 1.01.

52. The method of claim 38, wherein at least one gain element has a gain generated based on an impact ionization process.

53. The method of claim 38, wherein at least one gain element has a gain that is provided by over biasing the gain element.

54. The method of claim 38, wherein at least one gain element comprises a solid state electron multiplying amplifier.

55. The method of claim 38, wherein the at least one gain element has a gain larger than one by an amount such that a noise factor of the N gain elements is practicably minimized.

56. The method of claim 38, further comprising connecting one or more outputs of N gain elements respectively to one or more value detection circuits.

57. The method of claim 56, wherein said connecting one or more outputs of N gain elements respectively to one or more value detection circuits further comprises:
  operably coupling M comparators with M gain elements of the at least one cascade, wherein M is an integer that is less than or equal to N; and
  operably coupling M reference values with the M comparators.

58. A method of detecting light comprising:
  obstructing a first predefined portion of at least one defined wavelength of light incident upon a first photo-detector array;
  detecting the at least one defined wavelength of light with a photo-detector in a second photo-detector array; and
  receiving at least one signal representative of the at least one defined wavelength of light with at least one cascade of N gain elements operably coupled with at least one of the first photo-detector array and the second photo-detector array, the at least one cascade having at least
    N greater than or equal to a positive integer sufficient to provide said at least one cascade with a gain such that a predetermined operable signal at an input of said at least one cascade generates a signal at an output of said at least one cascade that is larger than a predetermined operable threshold value,
    an input of a gain element of said at least one cascade operably couplable with the at least one of the first photo-detector array and the second photo-detector array, and
    a gain element of the at least one cascade having a gain larger than one by an amount such that a noise factor of said at least one cascade operating on the predetermined operable signal at the input of said at least one cascade is substantially minimized.

59. The method of claim 58, wherein said obstructing a first predefined portion of at least one defined wavelength of light comprises:
  obstructing the first predefined portion of the light with a charge coupled device (CCD) in the first photo-detector array.

60. The method of claim 58, wherein said obstructing a first predefined portion of at least one defined wavelength of light comprises:
  obstructing the first predefined portion of the light with a complementary metal oxide semiconductor (CMOS) in the first photo-detector array.

61. The method of claim 58, wherein said obstructing a first predefined portion of at least one defined wavelength of light comprises:
  obstructing the first predefined portion of the light with a photo-detector in the first photo-detector array without substantially altering a relative spectral distribution of energy in a second unobstructed predefined portion of the light.

62. The method of claim 58, wherein said detecting the at least one defined wavelength of light with a photo-detector in a second photo-detector array comprises:
  detecting the at least one defined wavelength of light with a charge coupled device (CCD) in the second photo-detector array.

63. The method of claim 58, wherein said detecting the at least one defined wavelength of light with a photo-detector in a second photo-detector array comprises:
  detecting the at least one defined wavelength of light with a complementary metal oxide semiconductor (CMOS) in the second photo-detector array.

64. The method of claim 58, further comprising:
  obstructing a second predefined portion of the light with a photo-detector in the second photo-detector array.

65. The method of claim 58, further comprising:
  calculating an inferred brightness of light incident upon the first photo-detector.

66. The method of claim 65, wherein said calculating an inferred brightness of light incident upon the first photo-detector further comprises:
  calculating the inferred brightness of light incident upon the first photo-detector array in response to light incident upon the second photo-detector array.

67. The method of claim 58, further comprising:
  selecting one or more calculated inferred brightnesses of light incident upon the first photo-detector array as more probable inferences.

68. The method of claim 67, wherein said selecting one or more calculated inferred brightnesses of light incident upon the first photo-detector array as more probable inferences further comprises:
  selecting one or more calculated inferred brightnesses of light incident upon the first photo-detector array as more probable inferences in response to at least one photo-detector indicating a saturation.

69. The method of claim 67, wherein said selecting one or more calculated inferred brightnesses of light incident upon the first photo-detector array as more probable inferences further comprises:
  selecting one or more calculated inferred brightnesses of light incident upon the first photo-detector array as more probable inferences in response to at least two calculated brightnesses of light incident upon the first photo-detector array.

70. The method of claim 58, further comprising:
  detecting that a first gain element output of N gain elements in a cascade is below a first predefined threshold; and
  determining a digital conversion value in response to a detection that a second gain element output of the N gain elements in the cascade is above a second predefined threshold greater than the first predefined threshold.

* * * * *